(12) United States Patent
Nishihata et al.

(10) Patent No.: US 7,713,842 B2
(45) Date of Patent: May 11, 2010

(54) METHOD FOR PRODUCING BONDED WAFER

(75) Inventors: Hideki Nishihata, Tokyo (JP); Isoroku Ono, Tokyo (JP); Akihiko Endo, Tokyo (JP)

(73) Assignee: Sumco Corporation, Tokyo (JP)

( * ) Notice: Subject to any disclaimer, the term of this patent is extended or adjusted under 35 U.S.C. 154(b) by 0 days.

(21) Appl. No.: 12/286,344

(22) Filed: Sep. 29, 2008

(65) Prior Publication Data

US 2009/0098707 A1    Apr. 16, 2009

(30) Foreign Application Priority Data

Oct. 11, 2007  (JP)  ............................ 2007-265133
Sep. 4, 2008   (JP)  ............................ 2008-226648

(51) Int. Cl.
*H01L 21/30*  (2006.01)
*H01L 21/46*  (2006.01)

(52) U.S. Cl. ..................... 438/459; 438/311; 438/474; 438/9; 438/663; 257/E21.17; 257/E21.32; 257/E21.218; 257/E21.227; 257/E21.267

(58) Field of Classification Search .................... 438/9, 438/311, 474, 475, 508, 509, 459, 663, 680, 438/723, 724, 743, 744, 756, 757, 753
See application file for complete search history.

(56) References Cited

U.S. PATENT DOCUMENTS

| 6,461,939 | B1 * | 10/2002 | Furihata et al. | ............. 438/459 |
| 6,506,665 | B1 * | 1/2003  | Sato            | ............. 438/458 |
| 6,653,209 | B1 * | 11/2003 | Yamagata        | ............. 438/459 |
| 7,091,107 | B2 * | 8/2006  | Yokokawa et al. | ............. 438/455 |

* cited by examiner

*Primary Examiner*—David Nhu
(74) *Attorney, Agent, or Firm*—Sughrue Mion, PLLC

(57) ABSTRACT

In a method for producing a bonded wafer by bonding a wafer for active layer to wafer for support layer and then thinning the wafer for active layer, a terrace grinding for forming a terrace portion is carried out prior to a step of exposing the oxygen ion implanted layer to thereby leave an oxide film on a terrace portion of the wafer for support layer.

4 Claims, 4 Drawing Sheets
(1 of 4 Drawing Sheet(s) Filed in Color)

FIG. 3
(a)
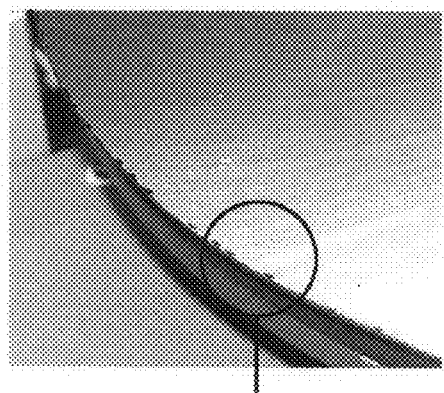
(b)
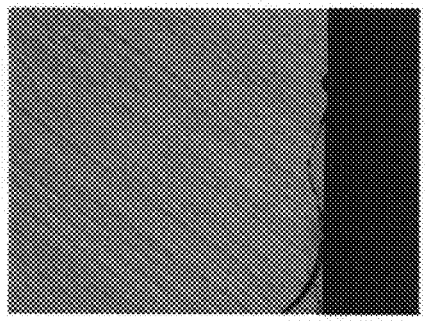
Before terrace grinding
(c)
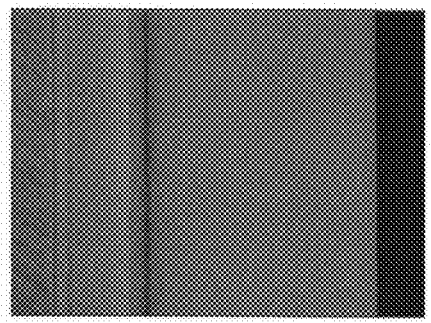
After terrace grinding

METHOD FOR PRODUCING BONDED WAFER

CROSS-REFERENCE TO RELATED APPLICATIONS

This application claims the benefit of Japanese Patent Application No. 2007-265,133, filed Oct. 11, 2007, and Japanese Patent Application No. 2008-226,648, filed Sep. 4, 2008.

BACKGROUND OF THE INVENTION

1. Field of the Invention

This invention relates to a method for producing a bonded wafer, and more particularly it is to effectively prevent the occurrence of flaws on front and back faces of the wafer to improve a thickness uniformity of a top layer at an outer peripheral portion of the wafer.

2. Description of the Related Art

As a typical production method of the bonded wafer, there are known a method wherein a silicon wafer having an oxide film (insulating film) is bonded to another silicon wafer and then one side of the bonded wafer is ground and polished to form SOI layer (grinding-polishing method), a method wherein oxygen ions are implanted into an interior of a silicon wafer and then a high-temperature annealing is conducted to form a buried oxide film inside the silicon wafer and then an upper part of the oxide film is rendered into SOI layer (SIMOX), a method wherein ions of hydrogen or the like are implanted into a surface layer portion of a silicon wafer for SOI layer (wafer for active layer) to form an ion implanted layer and thereafter the wafer is bonded to a silicon wafer for support substrate and then the bonded wafer is exfoliated at the ion implanted layer through a heat treatment to form SOI layer (smart cut method), and so on.

However, the grinding-polishing method has a problem that the thickness uniformity of the active layer is poor (±30% or more). On the other hand, the method using oxygen ion implantation (SIMOX) has a problem that SOI structures having different crystal orientations can not be produced so as to interleave the insulating layer.

In order to solve the above problems, the inventors have already developed a process combining the oxygen ion implantation method and the grinding-polishing method as disclosed in JP-A-H05-291543.

Besides, a production method of a bonded wafer having the following construction has been proposed in JP-A-2008-016534 (published on Jan. 24, 2008) as the process combining the oxygen ion implantation method and the grinding-polishing method. That is, it is a method for producing a bonded wafer by directly bonding a wafer for active layer provided or not provided on its surface with an insulting layer to a wafer for support layer and then thinning the wafer for active layer, which comprises time-orientedly combining a step of implanting oxygen ions into a wafer for active layer to form an oxygen ion implanted layer in the active layer, a step of subjecting the wafer for active layer to a heat treatment at a temperature of not lower than 1100° C. in a non-oxidizing atmosphere, a step of bonding the wafer for active layer to a wafer for support layer, a step of conducting a heat treatment for increasing a bonded strength, a step of grinding a portion of the wafer for active layer in the resulting bonded wafer short of the oxygen ion implanted layer, a step of further polishing or etching the wafer for active layer to expose the oxygen ion implanted layer, a step of oxidizing the bonded wafer to form an oxide film on the exposed surface of the oxygen ion implanted layer, a step of removing the oxide film, and a step of heat-treating at a temperature of not higher than 1100° C. in a non-oxidizing atmosphere.

By such a combination method it is made possible to directly provide a bonded wafer being excellent in the thickness uniformity of the active layer and relatively less in the defects as evaluated by a transmission electron microscope (TEM).

However, the following problems still remain in the technique disclosed in JP-A-H05-291543:
(1) Flaws are caused on the back face of the wafer for active layer during the grinding;
(2) Flaws are caused on the front face when the oxygen ion implanted layer is exposed by grinding or when the grinding is stopped at the oxygen ion implanted layer; and
(3) When the oxygen ion implanted layer is exposed by grinding or etching, or when the grinding or etching is stopped at the oxygen ion implanted layer, a thickness of a top layer in the vicinity of an outer peripheral portion of the wafer becomes non-uniform.

SUMMARY OF THE INVENTION

It is, therefore, an object of the invention to advantageously solve the above problems and to propose an advantageous production method of bonded wafer without causing not only flaws on the back face of the wafer for active layer but also flaws on front face in the stop of the grinding at the oxygen ion implanted layer and further the non-uniform thickness of the top layer in the vicinity of the outer peripheral portion of the wafer in the stop of the grinding or etching at the oxygen ion implanted layer.

The inventors have made minute investigations on each step of the bonding process for solving the above problems and discovered the followings.
(1) Chuck traces on back face of the bonded wafer at the grinding step (back face flaws) can be suppressed by conducting a heat treatment for increasing the bonded strength in an oxidizing atmosphere to form an oxide film having a constant thickness on at least a back face of a base substrate (wafer for support layer);
(2) In order to suppress the occurrence of front face flaws by peeling off a non-adhered part at the outer peripheral portion of the bonded wafer, it is effective to remove the non-adhered part by grinding at a pre-step thereof or conduct a terrace grinding; and
(3) When silicon in the base substrate at the outer peripheral portion of the bonded wafer (terrace portion) is exposed by the terrace grinding, the terrace portion is ground or etched by the grinding or etching stop of a post-step to cause the detachment of an outer peripheral portion of the oxygen ion implanted layer to thereby lose the top layer at the outer peripheral portion or thin the thickness of the silicon layer, which can be solved by leaving an oxide film durable to the grinding or etching on the terrace portion.

The invention is based on the above knowledge.

That is, the summary and construction of the invention are as follows.

1. A method for producing a bonded wafer by bonding a wafer for active layer to wafer for support layer with or without an insulating film and then thinning the wafer for active layer, which comprises a series of (1) step of implanting oxygen ions into a wafer for active layer, (2) step of bonding the wafer for active layer to a wafer for support layer with or without an insulating layer, (3) step of heat-treating for increasing a bonded strength, (4) step of thinning the wafer for active layer in the bonded wafer to expose the oxygen ion implanted layer, (5) step of removing the oxygen ion implanted layer in the wafer for active layer by oxidation or grinding and (6) step of planarizing and/or thinning the surface of the wafer for active layer by heat treatment and/or grinding, wherein a terrace grinding for forming a terrace portion is carried out prior to the step (4) of exposing the oxygen ion implanted layer.

2. A method for producing a bonded wafer according to the item 1, wherein an oxide film is left on a terrace portion of the wafer for active layer at the terrace grinding step.

3. A method for producing a bonded wafer according -to the item 1, wherein the heat treatment is carried out in an oxidizing atmosphere at the step (3) of heat-treating for increasing the bonded strength to form an oxide film of at least 150 nm over a whole surface of the bonded wafer.

4. A method for producing a bonded wafer according to the item 1, wherein a crystal orientation of each wafer face of the bonded wafer is a combination of (100) and (110) or (111).

According to the invention, the bonded wafer can be produced without causing not only flaws on the back face of the wafer for support layer but also flaws on the front face in the stop of the grinding at the oxygen ion implanted layer as well as the non-uniform thickness of the top layer on the vicinity of the outer peripheral portion of the wafer in the stop of the grinding or etching at the oxygen ion implanted layer.

BRIEF DESCRIPTION OF THE DRAWINGS

The patent or application file contains at least one drawing executed in color. Copies of this patent or patent application publication with color drawings will be provided by the Office upon request and payment of the necessary fee.

The invention will be described with reference to the accompanying drawings, wherein:

FIG. 3 is a photograph showing an outer peripheral portion of a bonded wafer after grinding or after terrace grinding, wherein (a) is a perspective view of the outer peripheral portion of the bonded wafer after the grinding, and (b) is an enlarged view of the outer peripheral portion of the wafer before the terrace grinding, and (c) is an enlarged view of the outer peripheral portion of the wafer after the terrace grinding.

DESCRIPTION OF THE PREFERRED EMBODIMENTS

Figure 1:
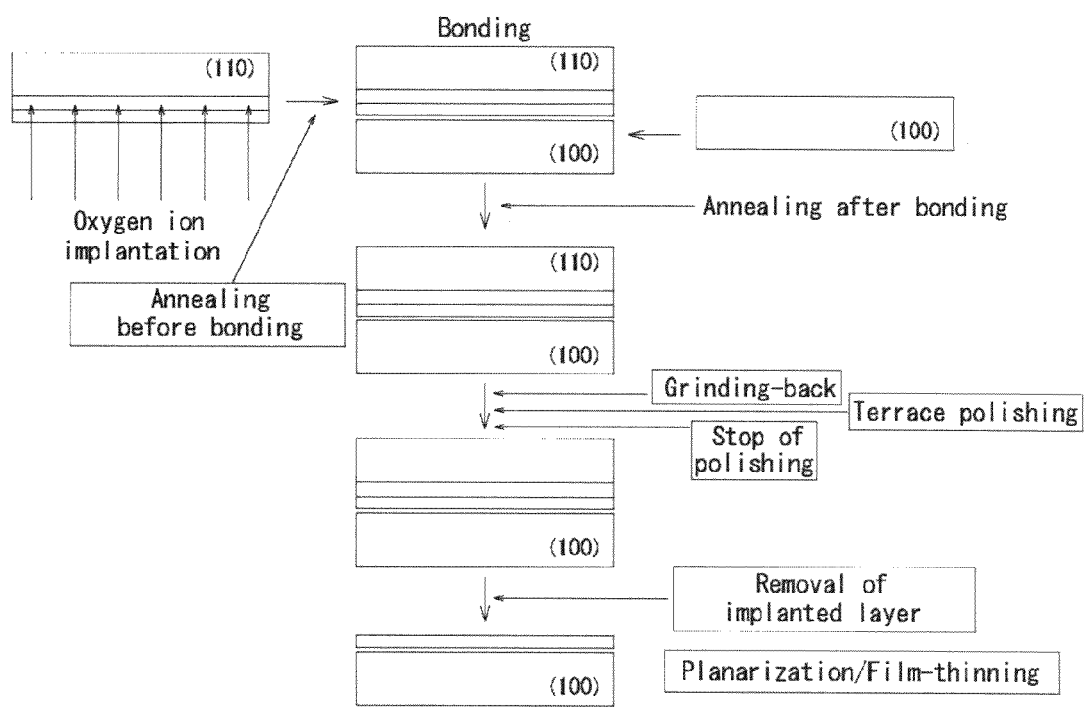
FIG. 1 is a flow chart of production steps according to a process of the invention.

At first, the invention will be concretely described with respect to a bonded wafer substrate and each production step according to a flow chart shown in FIG. 1.

Wafer Substrate

In order to prepare a bonded wafer, two silicon wafers, i.e. a wafer for active layer and a wafer for support layer are bonded to each other. In the invention, both the wafers may be bonded with or without an insulating film (an oxide film). Moreover, a kind and a concentration of a dopant, a concentration of oxygen and the like are not limited as long as the wafer to be bonded has a good surface roughness suitable for bonding. In order to more reduce defects, it is preferable to use a wafer having no COP or a less COP. For the reduction of COP may be applied a method of reducing COP by optimizing CZ drawing conditions, a method of subjecting a wafer to a high-temperature heat treatment of not lower than 1000° C. in a reducing atmosphere after mirror working, a method of epitaxial-growing Si on a wafer by CVD or the like, and so on.

(1) Step of Implanting Oxygen Ions into a Wafer for Active Layer

In the invention, the acceleration voltage in the oxygen ion implantation may be properly selected in accordance with the thickness of the active layer in the final product and is not particularly limited. Therefore, the oxygen ion implantation may be usually carried out at the acceleration voltage of about 100-300 keV. Also, it is preferable that the oxygen ion implantation is carried out at two stage.

An oxygen ion dose in the first implantation stage is preferable to be about $5\times10^{16}$-$3\times10^{17}$ atoms/cm$^2$. When the oxygen ion dose in the first implantation stage is less than $5\times10^{16}$ atoms/cm$^2$, the formation of SiO$_2$ layer is not sufficient and the stop of the grinding can not be conducted properly, while when it exceeds $3\times10^{17}$ atoms/cm$^2$, even if the implantation is carried out at a higher substrate temperature, the implantation damage becomes large and the number of defects increases. A preferable dose in the stop of the grinding is $5\times10^{16}$-$2\times10^{17}$ atoms/cm$^2$. On the other hand, when the stop of the etching is conducted with an alkali solution, SiO$_2$ layer is required to be completely continuous, so that the dose is preferable to be about $1\times10^{17}$-$3\times10^{17}$ atoms/cm$^2$.

In the first implantation stage of oxygen ions, the substrate temperature is preferably not lower than 200° C., more preferably not lower than 400° C. but not higher than 600° C. Moreover, if the temperature exceeds 600° C., it is difficult to heat the substrate in the ion implantation.

Next, an oxygen ion dose in the second implantation stage is preferable to be about $1\times10^{15}$-$5\times10^{16}$ atoms/cm$^2$. When the oxygen ion dose in the second implantation stage is less than $1\times10^{15}$ atoms/cm$^2$, amorphous layer is not formed sufficiently and the effect of stopping the growth of crystal defect is small, while when it exceeds $5\times10^{16}$ atoms/cm$^2$, the whole of the surface layer becomes amorphous and the active layer does not form a single crystal.

In the second implantation stage of oxygen ions, the substrate temperature is preferable to be lower than 200° C. When the temperature is not lower than 200° C., the amorphous layer is not formed sufficiently and the effect of stopping the growth of crystal defect is small. Preferably, the temperature is not lower than room temperature (about 20° C.) but not higher than 100° C. Moreover, it is required to add a mechanism for forcedly cooling the wafer to the implantation machine for making the temperature to lower than room temperature.

Furthermore, it is advantageous to conduct the cleaning between the first and second implantation stages. Because, particles generated in the first implantation stage serve as a mask in the second implantation stage and hence oxygen ions may not be implanted into portions corresponding to the particles. As a result, the amorphous formation is not sufficiently conducted in these portions, and there is a risk that the shooting of defects results in the occurrence of a surface defect. Similarly, the first implantation stage can be divided into plural times and the cleaning may be conducted therebetween. Moreover, as the cleaning means, it is preferable to use SC1, HF, O$_3$, an organic acid or the like having an excellent performance for removing the particles.

(2) Step of Bonding Wafer for Active Layer to Wafer for Support Layer

Then, the wafer for active layer is bonded to the wafer for support layer. In this case, both the wafers may be bonded to each other with or without an insulating film.

When the bonding is carried out through the insulating film, it is preferable to use an oxide film ($SiO_2$), a nitride film ($Si_3N_4$) or the like as the insulating film. As a film formation method are preferable a heat treatment in an oxidizing atmosphere or a nitrogen atmosphere (thermal oxidation, thermal nitriding), CVD and so on. As the thermal oxidation, wet oxidation using steam can be used in addition to the use of oxygen gas. Furthermore, the insulating film may be formed on the front-side substrate before the oxygen ion implantation or may be formed after the implantation. Moreover, the formation of the insulating film may be carried out on either the wafer for active layer or the wafer for support layer or both.

The wafer for active layer having the oxygen ion implanted layer in its active layer may be subjected to a heat treatment at a temperature of not lower than 1000° C. In this case, when the treatment is carried out in a reducing atmosphere, oxygen implanted in the vicinity of the outermost surface during the oxygen ion implantation can be diffused outward to lower the oxygen concentration, and hence it is possible to control the formation of oxygen precipitates in the vicinity of the outermost surface in the subsequent heat treatment for the bonding enhancement to more reduce the defect density. As the reducing atmosphere is preferable Ar or $H_2$ or a mixed atmosphere thereof. That is, the heat treatment is preferable to be carried out at a temperature of not higher than 1200° C., which is small in the probability of generating slip, without requiring a special heat-treating furnace or the use of a wafer supporting boat.

Moreover, the heat treatment may be carried out at a temperature of higher than 1200° C. In this case, it is necessary to conduct the treatment in an oxidizing atmosphere because $SiO_2$ particles produced in this treatment are decomposed when the heat treatment is conducted in a reducing atmosphere. Since the outward diffusion of oxygen implanted in the vicinity of the surface hardly occurs, it is necessary that all of oxygen implanted uses in the growth of $SiO_2$ produced in the ion implanted layer, so that it is preferable to keep a temperature of not lower than 1300° C. for not less than 5 hours for promoting the diffusion.

As an atmosphere for bonding is preferable a reducing atmosphere, and particularly Ar or $H_2$ or a mixed atmosphere thereof is advantageous. Also, the heat-treating temperature in the bonding is preferable to be not higher than 1000° C. for controlling the recrystallization of the amorphous layer.

Further, it is preferable that prior to the bonding, the cleaning treatment is conducted to suppress the occurrence of voids due to the particles. As the cleaning means, it is effective to use a general method for cleaning silicon wafer with SC1+ SC2, HF+$O_3$, an organic acid or a combination thereof In addition, the surface of silicon before the bonding is advantageous to be subjected to an activation treatment with plasma using oxygen, nitrogen, He, $H_2$, Ar or a mixed atmosphere thereof for enhancing the bonded strength.

Moreover, in case of the direct bonding, $H_2O$ adsorbed on the surface to be bonded changes into $SiO_2$ through the subsequent heat treatment, which is existent in the bonded interface, so that the formation of $SiO_2$ may be suppressed by cleaning the bonded face with HF and then bonding the hydrophobic faces with each other. Thus, the oxide can be reduced at the bonded interface to bring about the improvement of device characteristics.

(3) Step of Heat-Treating for Increasing Bonded Strength

The heat treatment for increasing the bonded strength is preferable to be carried out at a temperature of not lower than 1100° C. for not less than 1 hour for sufficiently increasing the bonded strength. The atmosphere is not particularly limited, but the oxidizing atmosphere is preferable ion view of the protection of back face of the wafer at the subsequent grinding step. Thus, an oxide film of not less than 150 nm is formed.

(4) Step of Grinding Wafer for Active Layer so as to Leave a Part Thereof

The grinding of the wafer for active layer in the bonded wafer is carried out by a mechanical working. In this grinding, a part of the wafer for active layer is left on a surface side of the oxygen ion implanted layer. The thickness of the portion of the wafer for active layer left is not particularly limited.

In order to shorten the time of subsequent grinding or alkali etching step, it is preferable to conduct the grinding just before the oxygen ion implanted layer. However, considering the precision of the grinding apparatus and the depth of damage through the grinding (about 2 μm), the thickness of residual Si film is preferable to be about 3-10 μm.

Moreover, the etching with an alkali solution may be conducted instead of the grinding. In this case, in order to avoid the etching of the rear face of the wafer for support layer, it is desirable to form a protection film such as an oxide film or the like on the rear face of the wafer.

Thus, the oxygen ion implanted layer is exposed by the grinding or etching. In the invention, it is important to conduct the following terrace grinding prior to the step of exposing the oxygen ion implanted layer. Because, when the oxygen ion implanted layer is exposed by the usual grinding treatment, as shown in FIG. 2(a), the non-adhered portion is left in the outer peripheral portion of the wafer.

(4)' Terrace Grinding Step

In the invention, it is a first feature to conduct the grinding of a terrace portion for removing the non-adhered portion of the bonded wafer prior to the step of exposing the oxygen ion implanted layer. As the terrace portion is completely removed, there is not caused a phenomenon that the non-adhered portion of the terrace is peeled off to give flaws to the surface of the wafer at the subsequent step such as grinding step.

Figure 2:
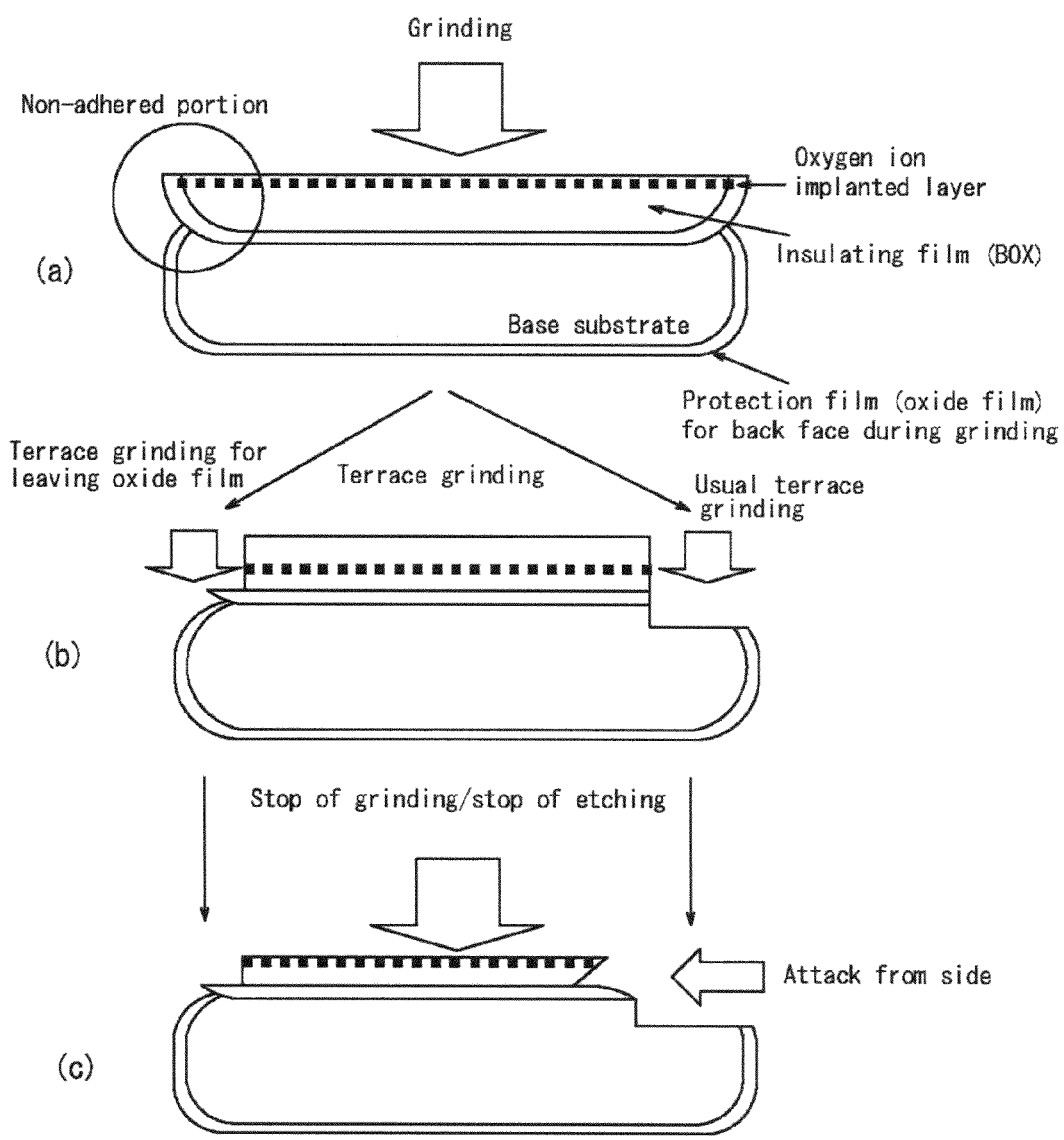
FIG. 2 is (a) a view showing a state of leaving a non-adhered portion on an outer peripheral portion of a wafer when an oxygen ion implanted layer is exposed by a usual grinding treatment, (b) a view illustrating terrace grinding according to a usual method and an invention method, respectively, and (c) a view showing a presence or absence of attack from side.

If the oxide film of the wafer for support layer is removed as shown in a right side of FIG. 2(b), there is caused a negative effect that SOI layer is corroded by attach from a side as shown in a right side of FIG. 2(c). In this connection, if the oxide film of the wafer for support layer is left in the terrace grinding as shown in a left side of FIG. 2(b), the attack from the side can be prevented as shown in a left side of FIG. 2(c).

In the invention, therefore, it is a second feature to leave the oxide film in the terrace portion of the wafer for support layer in the terrace grinding. For this purpose, it is preferable to conduct the terrace grinding under the following conditions. That is, an alkaline solution having an abrasive concentration (silica) of not more than 1 mass % is used. As the alkaline solution is advantageously adapted an organic alkali solution composed mainly of an amine (e.g. piperazine, ethylene diamine or the like).

The non-adhered portion may be easily removed by a mechanical action. Also, an etching rate ratio of SI/SiO2 is high owing to the grinding with the alkaline solution, and the grinding rate becomes smaller to not more than 1/10000 by the oxide film existing on the surface of the base substrate, so that the oxide film on the terrace portion is hardly ground and retains as a protection film for the terrace.

Moreover, in case of using a usual grinding solution having an abrasive concentration (silica) of 1 mass %, it is important to select conditions not completely removing the oxide film on the terrace by adjusting the grinding time and pressure. Also, in order to widen a device preparing region as far as possible, it is preferable to make a terrace grinding width small. Concretely, the width from the outer periphery of the wafer is about 1-5 mm, preferably not more than 2 mm.

In FIG. 3 are shown photographs showing an outer peripheral portion of a bonded wafer after the grinding and after the terrace grinding, respectively. FIG. 3(a) is a perspective view of the outer peripheral portion of the bonded wafer after the grinding, and FIG. 3(b) is an enlarged view of the outer peripheral portion of the wafer before the terrace grinding, and FIG. 3(c) is an enlarged view of the outer peripheral portion of the wafer after the terrace grinding.

When the grinding according to the subsequent step (5) is stopped at a state shown in FIG. 3(b), the non-adhered part in the outer peripheral portion of the wafer is peeled off to generate ground flaws. On the contrary, when the grinding according to the subsequent step (5) is stopped after the terrace grinding shown in FIG. 3(c), there is no peeling of the non-adhered part in the outer peripheral portion of the wafer and generation of ground flaws.

(5) Step of Further Grinding or Etching Wafer for Active Layer to Expose Oxygen Ion Implanted Layer Continuously, the wafer for active layer is further subjected to the grinding or etching to expose the oxygen ion implanted layer.

Grinding Process

When the grinding process is utilized as a treatment for thinning the film, it is preferable to conduct the grinding while feeding a grinding solution having an abrasive concentration of not more than 1 mass %. As the grinding solution is mentioned an alkaline solution containing abrasives (e.g. silica) at an abrasive concentration of not more than 1 mass %. Moreover, as the alkaline solution is preferable an inorganic alkali solution (KOH, NaOH or the like), an organic alkali solution (e.g. piperazine composed mainly of amine, ethylene diamine or the like) or a mixed solution thereof.

In this grinding process, since the abrasive concentration is not more than 1 mass %, the mechanical grinding action with the abrasives is hardly caused, and the chemical grinding action is preferential. That is, a part (Si layer) of the wafer for active layer is ground by the chemical grinding action with the alkaline solution. Since the etching rate ratio of $Si/SiO_2$ in the alkaline solution is high, the Si layer as a part of the wafer for active layer can be ground efficiently, whereas the $SiO_2$ layer is hardly ground. Therefore, even if the mechanical precision of the grinding apparatus is not sufficient, only the Si layer is ground without substantially grinding the oxygen ion implanted layer, so that the oxygen ion implanted layer can be exposed uniformly.

Moreover, as compared with the following etching process, the merit of the grinding process lies in a point that a thin film layer having an excellent in-plane thickness uniformity can be produced without giving any damage to the Si active layer as a part of the front side silicon wafer isolated by the oxygen ion implanted layer even if the oxygen ion implanted layer is not a completely continuous $SiO_2$ layer. In this case, since the terrace is protected by the oxide film, the oxygen ion implanted layer on the outer peripheral portion of the bonded wafer is protected without grinding the terrace, and hence a top silicon layer having a uniform thickness up to the outer peripheral portion can be obtained.

Etching Process

In the above film thinning treatment, the front-side silicon wafer located side the oxygen ion implanted layer can be removed by using an alkaline etching solution. As the alkaline etching solution is used, for example, KOH, NaOH or the like. When the $SiO_2$ layer formed in the oxygen ion implanted layer is not continuous, the alkali solution may insert from spaces between $SiO_2$ particles to etch out a part of the active layer. In order to prevent this phenomenon, it is preferable that the heat treatment before the bonding and/or the heat treatment for increasing the bonded strength is carried out at a temperature of not lower than 1300° C. for a sufficient time of not less than 5 hours.

Moreover, the etching process may be a batch system wherein a plurality of wafers are simultaneously etched in an etching tank, or a sheet-feed system wherein the wafers are etched by spraying the alkali solution onto the individual wafers.

Combination of Etching Process and Grinding Process

The oxygen ion implanted layer may be exposed by a combination of the etching process and the grinding process. Particularly, when Si is etched before the grinding, a boundary between the terrace (an outermost peripheral region of 1-3 mm not bonding two wafers to each other) and the bonded region becomes smooth to suppress the occurrence of particles. Moreover, only the terrace may be ground before the grinding process.

Dry Etching Process

A gas selectively etching silicon such as $CF_6$, $SF_6$ or the like may be used in addition to the above grinding process and etching process.

(6) Step of Removing Oxygen Ion Implanted Layer

The exposed oxygen ion implanted layer must be removed because many crystal defects due to the formation of $SiO_2$ or the ion implantation are existent therein. As a removal method, there are an etching process, an oxidation process, a grinding process and the like.

Etching Process

This etching process is a method of removing $SiO_2$ by immersing in HF solution, wherein the wafer is immersed in a 30-50% HF solution for about 1-30 minutes. In case of the bonded wafer with the oxide film, since the oxide film is exposed at the peripheral portion of the wafer (terrace), the oxide film is etched out by the immersion in a high concentration HF for a long time. If the etched amount is large, the peeling of the top layer is caused at the peripheral portion of the wafer resulting in the occurrence of particles. Therefore, a goal for the removal of $SiO_2$ is preferable to be a condition that the surface of the wafer as a whole becomes a water-repellent surface.

Also, the oxygen ion implanted layer is a mixed layer of $SiO_2$ and Si depending on the oxygen dose and heat-treating conditions, which may not be removed by HF immersion completely.

When the heat treatment before the bonding or the heat treatment for increasing the bonded strength is a low-temperature, short-time treatment not forming the complete $SiO_2$ layer, the crystal defects existing in the vicinity of the oxygen ion implanted layer can not be removed completely, so that the removal step of the defect region is further required.

Oxidation Process

This process comprises a step of forming an oxide film of a predetermined thickness on the exposed oxygen ion implanted layer and a step of removing the resulting oxide film.

Since it is enough to conduct the oxidation in an oxidizing atmosphere, the treating temperature is not particularly limited, but is preferably 600-1100° C. Also, the thickness of the oxide film after the oxidation is not limited.

However, when many crystal defects are existent in the oxygen ion implanted layer, a treatment at a lower temperature, preferably about 600-900° C. is preferable for controlling the growth of the crystal defects into the active layer during the heat treatment. When the oxidation is carried out at the lower temperature, a wet oxidation using a steam or a hydrochloric acid oxidation including an oxidizing gas such as HCl gas can be applied for increasing a growing rate of oxide film, which is more preferable for obtaining a high throughput.

The thickness of the oxide film is not particularly limited, but when the crystal defect layer is existent in the oxygen ion implanted layer, it is preferable to be larger than the thickness of the crystal defect layer. The thickness of the oxide film is preferably about 100-500 nm under the conditions of oxygen ion implantation according to the invention. When the thickness of the oxide film is less than 100 nm, the crystal defect region can not be removed sufficiently, while when it exceeds 500 nm, the thickness uniformity of the active layer is deteriorated due to the breakage of the in-plane uniformity of the oxide film.

The removal of the oxide film may be carried out by cleaning with HF solution or by etching through annealing with hydrogen gas or Ar gas or a gas containing HF. Here, the above oxidation treatment and removal treatment may be carried out plural times. Thus, it is possible to conduct more thinning of the active layer while maintaining the planarized surface roughness.

After the removal of the oxide film, it is advantageous to remove the particles and metallic impurities attached to the surface of the bonded wafer by immersing the bonded wafer in, for example, a mixed solution of an organic acid and hydrofluoric acid.

Moreover, the oxidation may be carried out after the removal of $SiO_2$ in the oxygen ion implanted layer by immersing in the HF solution.

(7) Step of Planarizing or Thinning Surface of Wafer for Active Layer

The surface of the bonded wafer after the removal of the oxygen ion implanted layer is rough as compared with the mirror polishing, so that it is necessary to be planarized. As the planarization are applicable a polishing process, a heat treatment in a reducing atmosphere, a gas etching with a gas or an ion or a radical capable of etching Si, and the like.

Polishing Process

The surface of the bonded wafer is slightly polished to improve the roughness. The polishing margin is preferable to be about 10-500 nm. When it is less than 10 nm, the roughness can not be improved sufficiently, while when it exceeds 500 nm, the thickness uniformity of the active layer is deteriorated. By this treatment can be rendered the surface roughness (RMS) into not more than 0.5 nm.

Heat Treatment in Reducing Atmosphere.

The surface roughness of the bonded wafer is improved by heat-treating in Ar atmosphere, $H_2$ atmosphere or a mixed atmosphere thereof. The treating temperature is preferable to be not lower than 1000° C. but not higher than about 1300° C. As to the treating time, a long time is required at a lower temperature, but it is preferable that the treating time is about 1-2 hours at 1000-1200° C., about 10-30 minutes at 1200-1250° C. and about 1-5 minutes above 1250° C. If the heat treatment is carried out at a higher temperature for a longer time exceeding the above temperature and time, there is a fear of deteriorating the in-plane uniformity of the active layer sue to the etching action of the reducing atmosphere.

As a heat-treating furnace are preferable a resistance heating type vertical furnace capable of simultaneously treating plural wafers, a lamp heating type RTA (high-speed temperature rising-descending furnace) treating individual wafers, and the like. Particularly, RTA is effective in the treatment above 1200° C.

By this heat treatment, the surface roughness (RMS) can be rendered into not more than 0.5 nm likewise the polishing process.

Moreover, the removal of oxide film generated on the surface by the heat treatment can be attained by cleaning with HF solution, or by etching through annealing with a hydrogen gas, Ar gas or a HF-containing gas.

Thus, there can be obtained a bonded wafer being excellent in the thickness uniformity (small non-uniform region at outer peripheral portion of wafer) and less in the defect (flaws on front and rear surfaces) and having a planarized surface roughness.

According to the invention, it is made possible to directly bond silicon wafers having different crystal orientations (e.g. bonding of 110 crystal and 100 crystal, bonding of 111 crystal and 100 crystal, or the like) to prepare a bonded wafer.

EXAMPLE 1

There are proved two silicon wafers having a diameter of 300 mm and a (100) crystal orientation sliced from a silicon ingot grown by CZ method and doped with boron. The silicon wafer is p-type and has a specific resistance of 1-10 Ω cm.

An oxide film of 150 nm in thickness is formed on a (100) wafer used as a wafer for active layer in the two silicon wafers by treating at 1000° C. in an oxidizing atmosphere for 5 hours.

Then, an oxygen ion implantation is carried out from the surface of the (100) wafer as the wafer for active layer at an acceleration voltage of 180 keV. The oxygen ion implantation is conducted at two stages, wherein a first stage is carried out at a substrate temperature of 200-600° C. and a dose of $1 \times 10^{17}$ atoms/cm$^2$, and a second stage is carried out at a substrate temperature of from room temperature to not higher than 300° C. and a dose of $5 \times 10^{16}$ atoms/cm$^2$. As a result, an oxygen ion implanted layer is formed at a depth position of about 400 nm from the surface of the wafer for active layer.

Next, both the wafers are subjected to a cleaning with HF+ozone to remove particles from surfaces to be bonded and thereafter bonded to each other.

Thereafter, a heat treatment is carried out for strongly bonding the bonded interface. The heat treating conditions are 1100° and about 2 hours in an oxidizing gas atmosphere, whereby an oxide film of about 300 nm in thickness is formed on a rear face of the bonded wafer and used as a protection film for the rear face in a subsequent working.

Then, the surface of the wafer for active layer in the bonded wafer is ground by a predetermined thickness using a grinding apparatus. That is, the grinding treatment is carried out at the surface side of the oxygen ion implanted layer so as to leave only a part of the wafer for active layer (corresponding to a thickness of about 5 μm).

A terrace grinding is carried out for removing a non-adhered part of the bonded wafer. This terrace grinding is conducted with respect to a region of 2 mm from an outer periphery of the wafer. In this case, an alkaline solution having an abrasive (silica) concentration of not more than 1 mass % is used for leaving the oxide film on the terrace according to the invention. The alkaline solution is an organic alkali solution composed mainly of amine (such as piperazine, ethylene diamine or the like). For the comparison, a solution having an abrasive (silica) concentration of 3 mass % is used so as not to leave the oxide film on the terrace.

In addition, the surface of the bonded wafer after the grinding is polished to expose the oxygen ion implanted layer while feeding a polishing agent including abrasives (silica) at an abrasive concentration of not more than 1 mass %. As the polishing agent is used an alkaline solution having an abrasive concentration of not more than 1 mass %. The alkaline solution is an organic alkali solution composed mainly of amine (such as piperazine, ethylene diamine or the like).

Figure 4:
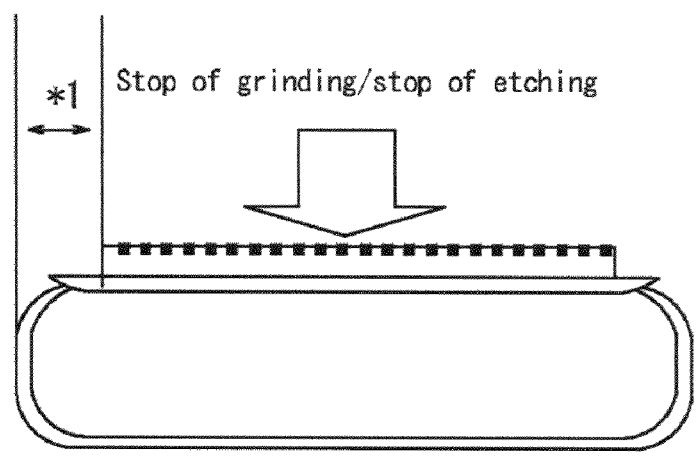
FIG. 4 is a schematic view showing a residual region (terrace width) in an outer peripheral portion of a top layer.

At this state, there are examined the presence or absence of flaws generated on the bonded surface and the degree (mm) of retaining the top silicon layer from the outer periphery of the wafer. The examined results are shown in Table 1. Moreover, the term "retaining region (terrace width) of top layer at outer peripheral portion" in the table means a length shown by *1 in FIG. 4.

As the etching process is used an etching of a sheet-feed system, wherein KOH is sprayed onto only the surface of the bonded wafer to remove a silicon layer on the upper part of the oxygen ion implanted layer.

At this state, there are examined the presence or absence of flaws generated on the bonded surface and the degree (mm) of retaining the top silicon layer from the outer periphery of the wafer. The results are also shown in Table 1.

As seen from the above table, even if the stop of the etching is carried out instead of the stop of the grinding, when the terrace grinding is conducted according to the invention, there is no occurrence of surface flaws on the wafer after the stop of

TABLE 1

| No. | Presence or absence of terrace grinding | Presence or absence of oxide film on terrace | Method of stopping oxygen ion implanted layer | Presence or absence of surface flaws on wafer after the stop of grinding | Retaining region (terrace width) of top layer at outer peripheral portion *1 | Remarks |
|---|---|---|---|---|---|---|
| 1 | absence | — | grinding | presence (not less than 10 defects of several mm) | — | Comparative Example |
| 2 | presence | absence | grinding | absence | 27 mm | Invention Example |
| 3 | presence | presence | grinding | absence | 3.2 mm | Invention Example |
| 4 | presence | absence | etching | absence | 15 mm | Invention Example |
| 5 | presence | presence | etching | absence | 2.5 mm | Invention Example |

As seen from the above table, when the terrace grinding according to the invention is carried out before the step of exposing the oxygen ion implanted layer, there is no occurrence of surface flaws after the stop of the grinding, and further when the oxide film is left on the terrace portion of the wafer for support layer, the terrace width after the stop of the grinding could be made as small as 3.2 mm.

Thereafter, the bonded wafer is cleaned by the following treatments. That is, the wafer is immersed in a dissolved-ozone aqueous solution having an ozone concentration of 5 ppm, an aqueous solution formed by mixing 0.06 mass % of citric acid as an organic acid with pure water, an aqueous solution containing 0.05 mass % of hydrofluoric acid, an aqueous solution containing 0.6 mass % of citric acid as an organic acid added to pure water and a dissolved-ozone aqueous solution of room temperature having an ozone concentration of 5 ppm in this order. Each of the treating times is 5 minutes, and the temperature is room temperature. By this cleaning treatment are removed metallic impurities and particles from the surface of the bonded wafer.

After the above cleaning, the bonded wafer is finished by subjecting to a heat treatment in an argon gas atmosphere at 1100° C. for 2 hours.

The thus obtained active layer has a thickness of 100-200 nm, and the scattering of in-plane thickness distribution is in a range of 10-20%.

EXAMPLE 2

A bonded wafer is prepared under the same conditions as in Example 1 except that the stop of the etching with an alkaline solution is carried out instead of the stop of the grinding.

the grinding, while when the terrace grinding is carried out so as to leave the oxide film, the terrace width is as small as 2.5 mm.

What is claimed is:

1. A method for producing a bonded wafer by bonding a wafer for active layer to wafer for support layer with or without an insulating film and then thinning the wafer for active layer, which comprises a series of steps of: (1) implanting oxygen ions into a wafer for active layer; (2) bonding the wafer for active layer to a wafer for support layer with or without an insulating layer; (3) heat-treating for increasing a bonded strength; (4) thinning the wafer for active layer in the bonded wafer to expose the oxygen ion implanted layer; (5) removing the oxygen ion implanted layer in the wafer for active layer by oxidation or grinding; and (6) planarizing and/or thinning the surface of the wafer for active layer by heat treatment and/or grinding, wherein a terrace grinding for forming a terrace portion is carried out prior to the step (4) of exposing the oxygen ion implanted layer.

2. A method for producing a bonded wafer according to claim 1, wherein an oxide film is left on a terrace portion of the wafer for active layer at the terrace grinding step.

3. A method for producing a bonded wafer according to claim 1, wherein the heat treatment is carried out in an oxidizing atmosphere at the step (3) of heat-treating for increasing the bonded strength to form an oxide film of at least 150 nm over a whole surface of the bonded wafer.

4. A method for producing a bonded wafer according to claim 1, wherein a crystal orientation of each wafer face of the bonded wafer is a combination of (100) and (110) or (111).

* * * * *